United States Patent [19]

Vegeais et al.

[11] Patent Number: 4,806,947
[45] Date of Patent: Feb. 21, 1989

[54] SERIES TYPE THERMAL WRITING HEAD FOR PRINTER

[75] Inventors: Patrick Vegeais, Saint Germain en Laye; Michel Bergougnoux, Franconville, both of France

[73] Assignee: Societe D'Applications Generales D'Electricite, Paris, France

[21] Appl. No.: 15,385

[22] Filed: Feb. 17, 1987

[30] Foreign Application Priority Data

Feb. 21, 1986 [FR] France ................... 86 02392

[51] Int. Cl.⁴ ............................................. G01D 15/10
[52] U.S. Cl. ............................. 346/76 PH; 219/216
[58] Field of Search ............. 346/76 PH; 400/120; 219/216 PH

[56] References Cited

U.S. PATENT DOCUMENTS 3,845,850 11/1974 Herr et al. ............... 346/76 PH X
3,968,500 7/1976 Meisel et al. ........................ 346/139
4,361,855 11/1982 Nozaki et al. ......................... 346/76

FOREIGN PATENT DOCUMENTS 2246436 4/1974 Fed. Rep. of Germany .
2548593 1/1985 France .
2145667A 4/1985 United Kingdom .

Primary Examiner—E. A. Goldberg
Assistant Examiner—M. M. Lateef
Attorney, Agent, or Firm—Stevens, Davis, Miller & Mosher

[57] ABSTRACT

A series type thermal writing head for printers is provided including, on a rigid wafer, ceramic supporting resistive elements with their conductors, a double face printed circuit forming connection support, a flexible connection film printed on a single face, with conducting tracks connecting together the conductors of the resistive elements and the conductors of the printed circuit, those of the face turned towards the wafer by metallized holes.

6 Claims, 2 Drawing Sheets

SERIES TYPE THERMAL WRITING HEAD FOR PRINTER

BACKGROUND OF THE INVENTION

1. Field of the Invention

The present invention relates to a thermal printing or writing head for printers of data transmission systems, particularly word processing systems.

2. Description of the Prior Art

A thermal writing head generally includes a plurality of resistive elements adapted to have a current flowing therethrough and so to heat up, and to cooperate either directly with a printing medium, a thermosensitive paper, or indirectly with an ordinary printing medium, by means of a ribbon coated with an ink which melts with the heat of the elements. In the first case, direct thermal printing occurs and in the second case a thermal transfer printing occurs.

A series type thermal printing may be employed in which a mobile head has at least one generally vertical strip of elements aligned in an orthogonal direction to the direction of rectilinear travel, during the printing of a line of characters, corresponding to the height of the strip, of a carriage supporting the head.

A line type thermal printing may also be used in which the head, which is immobile, includes a generally horizontal row of numerous elements, of a width compatible with the width of the medium intended to be printed during its travel orthogonally to the row of elements.

From a so called printing card, or a transition card, the resistive printing elements must be supplied with current during given time intervals as a function of the characters, or graph representations, to be printed. For this, the resistive elements are connected electrically to the card in question by conductors adapted for cooperating mechanically and electrically with the terminals of a connector integral with the card.

The most widely used solutions to this connection problem use a specific female connector having a single row of terminals integral with the card.

The resistive elements are formed on a basic substrate, generally a ceramic.

The line printing heads include, as has already been mentioned, a large number of heating elements, therefore formed on a large sized substrate. Heads are often used having 1728 elements. Since ceramic is a costly material, the useful life of these heads is easily that of the printers, all the more so since its elements are relatively little actuated. They do not consequently need to be replaced.

The series printing heads have a much lower number of elements, their basic substrate is much less cumbersome and so much less expensive, and these heads may be interchangeable and interchanged.

By way of example, it is acknowledged that a series head, for printing characters 3 mm high with 8 points per millimeter, having therefore a strip of 24 elements, has a lifespan corresponding only to the printing of 10,000 conventional A4 formats.

A series head with 24 heating elements, for example, has not 48 conductors, nor 25 including one ground conductor, but 30 conductors including 6 ground conductors for taking into account the sections of the conductors and the current densities but this is a high number.

If the pitch of the connection conductors, formed on the substrate of the head, corresponds to the pitch of the terminals of the conductor of the card, the substrate mounted on the support may play directly the row or male connector for the female connector of the card. It will however be readily understood that in the case of a large number of conductors, such as 30, such a solution is not satisfactory for it is based on a large sized and consequently expensive substrate. This solution may even be proscribed in the case of a limited number of conductors, because of the small range of dimensions of female card connectors which limits the reduction of the size of substrates. And the implantation on the substrate of a series-parallel control converter does not for all that overcome the disadvantages.

If the number of conductors or conducting tracks is high, on the one hand, and if the pitch is small by being formed on a substrate as reduced in size as possible, on the other hand, and that remains true with a small number of conductors because of the minimum dimensions of the female card connectors, the solution then consists in interposing a flexible track supporting film with an enlarged connection portion for converting the pitch.

Flexible film series printing heads are known, used as a "carriage", connecting the substrate with its heating elements directly to the electronic cards controlling the current supply. In these embodiments, the flexible film follows a complicated path and the replacement of these heads, with their carriage, can only be carried out by a qualified person and not by the operator of the printer not having the appropriate tools.

Series printing heads are further known having, on a wafer, a heating element substrate with the heating elements and associated conductor portions, a connection support and a double face flexible film, with printed tracks on both its faces, melted or pressed on the substrate at one end for connecting the tracks, on its face turned towards the wafer, to the conducting portions of the substrate, and bonded to the connection support at the other end, where the tracks are printed on its other face so as to be able to cooperate with the terminals of the female card connector.

Providing that the wafer of these heads is rigid, that these heads are compact and so that the length of their flexible film is small, they may be readily dismantled by the operator of the printer.

However, all the connection contacts of these heads, at the end of the flexible film connected to metallized holes, are disposed on the same face: or else the connection is provided by means of specific female connectors, having a single row of terminals, which have been effectively developed for this purpose, as recalled above, or else the connection is made by means of an additional male type connector.

The present invention aims then at providing a series thermal printing head which may be connected to a conventional commercially available female connector, and which may be readily dismantled.

SUMMARY OF THE INVENTION

For this, the present invention relates to provides a series type thermal writing head for printers, including a substrate with, thereon, resistive writing elements with associated conductors, a connection support, flexible film carrying conducting tracks connected electrically to the conductors of the substrate and integral, at its two end portions, with the substrate and with the connection support respectively, wherein the tracks of the film are printed on only one of its faces and the connection support carries conductors connected respectively electrically to the tracks of the film and printed on both its faces.

With the invention, the flexible film is printed on a single face, which already forms a first advantage and, since the connection support is printed on both faces, the head may be connected to a conventional female type connector with two rows of contacts, for a very low average price, which forms a second and important advantage, in addition to the simplicity of dismantling and reassembling the head.

Despite its simplicity, the writing head of the invention is nevertheless original. It is true that double faced circuits were already known. But the combination of a double faced circuit and a single face connecting film in a writing head does not lead to the invention but to a support and a connection film both doubled faced or with metallized holes since, in a writing head with single face connection film, the substrate and the connection support are necessarily disposed on each side of the film.

Furthermore, it will be noted that the pitch of the printed conductors on the double face connection support of the head of the invention is larger than that of the conductors of the single face support adapted for cooperating with specific connectors.

BRIEF DESCRIPTION OF THE DRAWINGS

The invention will be better understood from the following description of the preferred embodiments of the writing head of the invention, with reference to the accompanying drawings in which.

DESCRIPTION OF THE PREFERRED EMBODIMENT

Figure 1:
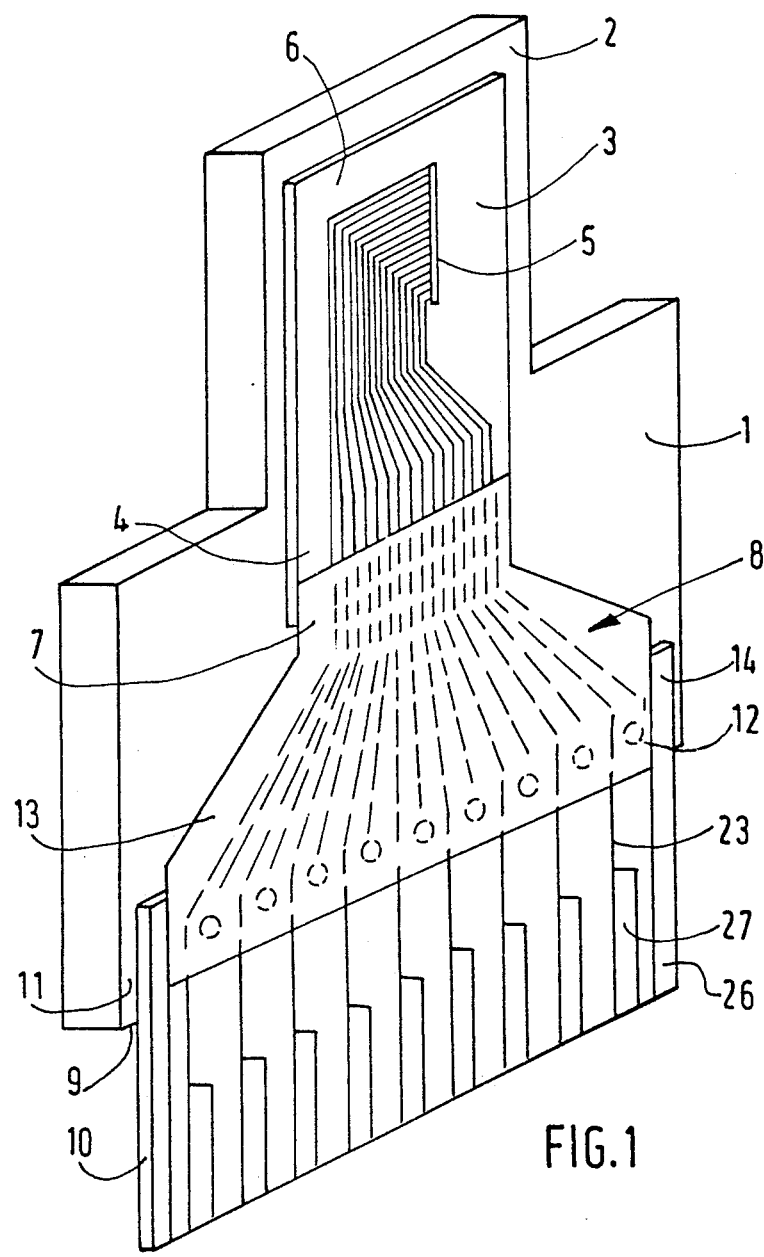
FIG. 1 shows a perspective view of the writing head of the invention.

The thermal printer writing head shown in the drawings is formed on a rigid wafer 1, of a general parallelepipedic shape, with a longitudinal plane of symmetry, having a reduced width writing head 2. On the writing portion 2, and slightly therebeyond is bonded a ceramic substrate 3 of rectangular shape. On substrate 3 are deposited resistive elements 15 aligned parallel to the general plane of symmetry of the head and forming a writing strip 5. Each of these resistive elements is connected to two conductors so that a heating and so printing current flows therethrough during given time intervals.

On the end portion 4 of substrate 3, intended to be turned towards the printer, the other end portion 6 being intended to extend more or less along a printing medium, is fixed a small end portion 7 of a flexible film 8, substantially of the same width as substrate 3 and of small length. On the end strip 11 of the widened portion of the wafer 1, and projecting beyond its transverse edge 9, is fixed a connection support 10, of rectangular shape, substantially of the same width as wafer 1.

The flexible film 8, of a general rectangular shape and symmetrical with respect to the plane of symmetry of the whole of the head, includes a small rectangular portion 12 substantially of the same width as the connection support 10 to the end portion 14 of which, turned towards substrate 3, it is fixed by bonding, screwing or riveting. The portions 7 and 12 of the flexible film 8 are connected by a trapezoidal shaped portion 13 widening from portion 7.

Substrate 3 carries then conductors connected to the resistive elements 15. The flexible film 8 also carries conductors or conducting tracks on its face turned towards wafer 1: it is a single face flexible film. The connection support 10 also carries conductors but on both its faces: it is a double face printed circuit.

It will now be described how these conductors of substrate 3, of the flexible film 8 and of the printed circuit 10 are connected together.

Figure 2:
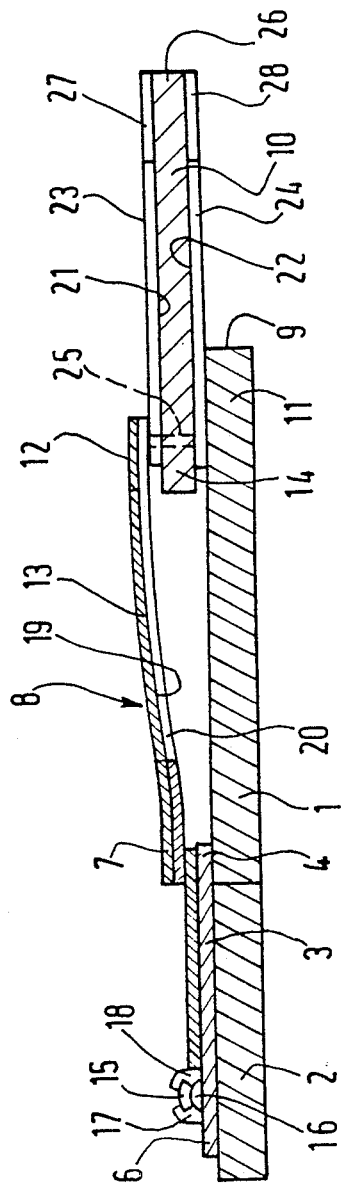
FIG. 2 shows a sectional view, through a plane parallel to its general plane of symmetry, of the head of FIG. 1.

Let us consider, with reference to FIG. 2, one of the resistive elements 15 of substrate 3 whereas, for the sake of clarity, all the other elements 15 of strip 5 have not been shown. It should simply be recalled that the sectional plane of FIG. 2 is parallel to the plane of symmetry of the head and so to strip 5.

The resistive element 15 has been deposited on a tongue 16 fixed to the substrate 3. Tongue 16 is to play a role of thermal filter. In operation, it serves as reflector reflecting the heat towards the printing medium, not shown, extending parallel to wafer 1, on the other side of the resistive element 15. When stopped, it serves on the contrary as radiator. The resistive element 15 is connected to two conductors 17, 18, made preferably from gold, one of which is connected to ground. A protective layer generally covers the resistive elements. On one side of the strip of resistive elements 15, all the conductors 17, 18 extend over the ceramic 3 substantially parallel to each other. The sectional plane of FIG. 2 extends along one of these conductors. In practice, a control dispatcher, known per se, may also be integrated on substrate 3, to which conductors 17, 18 will be connected on one side and, on the other side, other conductors to be connected to the tracks of the flexible film.

The flexible film 8, has, printed on its single face 19 turned towards wafer 1, a bundle of conductor tracks 20, relatively close together at the level of the end portion 7, and spaced further apart at the level of the end portion 12, under which portion 7, 12 the tracks extend parallel to each other. In the portion 13 of the flexible film 8 they diverge.

All the tracks 20 of the flexible film 8 are connected to all the conductors 17, 18 of the ceramic 3, respectively. This, the end portion 7 of the flexible film 8 is pressed against the end portion 4 of the ceramic 3 so that the conductor 17, 18 of the ceramic 3 is mechanically and so electrically joined to the track 20 of the flexible film 8. In FIG. 2, substantially only the part of tack 20 shown disposed under the end portion 7, extends in the sectional plane.

The printed circuit 10, forming a connection support, includes on both its faces 21, 22 two groups of conductors 23, 24 parallel to each other, and all connected to the tracks 20 of the flexible film 8, respectively. More precisely, and with the pitch of the conductors of circuit 10 being here double that of the tracks 20 of the flexible film, the conductors 23 are connected to tracks 20 of uneven rank and conductors 24 to tracks 20 of even rank as can be seen in FIG. 2 a track 20 of even rank is connected to a conductor 24, printed on the face 22 of the circuit 10 opposite that 21 which is turned towards the flexible film 8 and receives it through a metallized hole 25 between two conductors 23.

Near the end 26 of circuit 10, opposite its end 14, the conductors 23, 24 are widened so as to form contact terminals 27, 28.

It will be noted that, in the example shown, passage to the double face system, through metallized through holes 25, is provided in line with the zone where the flexible film 9 and the connection circuit 10 are superimposed. This is however not a limitative characteristic of the invention. The pitch conversion could just as well be made elsewhere, for example well beyond this superimposition zone, towards the middle of circuit 10, in this case, a track 20 of even rank of film 8 would be connected to a conductor 24 on face 22 by a metallized hole and a printed conductor portion between two conductors 23 on face 21 and it would be directly connected to this track 20.

Thus, the thermal writing head which has just been described includes a male type connector part 26, 27, 28 capable of cooperating with a commercially available female type connector with two rows of contacts with standardized pitch, for example 2.54 mm.

Disassembly and reassembly, and so the interchangeability thereof, are readily carried out directly by the operator of the printer without requiring a tool.

Furthermore, the contact forces, once the connectors are connected, are suitably distributed and opposed.

A head has been described having conductors printed on circuit 10 in number equal to the conductors printed on film 8 and with alternate through holes in circuit 10. Of course, without departing from the scope of the invention conductors may be adopted on circuit 10 in a different number or these conductors need not necessarily be associated with those of film 8 two by two.

What is claimed is:

1. A thermal writing head for a printer comprising:
   a substrate supporting on only one face thereof a plurality of resistive writing elements and associated conductors;
   a flexible film having a plurality of conductive tracks printed on only one face thereof, said film having a first end portion secured to said substrate such that the conducting tracks of said film are facing and electrically connected to corresponding conductors of said substrate; and
   a connection support having conductors printed on two opposite faces thereof, a conductor on one of the opposite faces of said connection support being electrically connected to an associated conductor on the other opposite face of said connection support, said connection support being secured to a second end portion of said flexible film such that the conducting tracks of said film are facing and electrically connected to respective conductors on one of the opposite faces of said connection support.

2. The writing head as claimed in claim 1, wherein the pitch of the conductors printed on the connection support is greater than the pitch of the tracks printed on the flexible film.

3. The writing head as claimed in claim 1, wherein the conductors, printed on the face of the connection support opposite that facing the film, are connected to associated conductive tracks of the film through metallized holes.

4. The writing head as claimed in claim 3, wherein the metallized holes are formed in line with a zone where the film and the connection support are superimposed.

5. The writing head as claimed in claim 3, wherein the metallized holes are formed substantially in the middle of the connection support.

6. The writing head as claimed in claim 1, wherein the substrate supporting the resistive elements and the connection support are fixed to a rigid wafer.

* * * * *